(12) United States Patent
Zhu et al.

(10) Patent No.: US 12,125,505 B2
(45) Date of Patent: Oct. 22, 2024

(54) QUICK-RELEASE HARD DISK BRACKET

(71) Applicant: INSPUR SUZHOU INTELLIGENT TECHNOLOGY CO., LTD., Jiangsu (CN)

(72) Inventors: Jingxian Zhu, Jiangsu (CN); Zhencai Cao, Jiangsu (CN); Ying Qian, Jiangsu (CN); Zhanyang Li, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/023,660

(22) PCT Filed: Nov. 30, 2021

(86) PCT No.: PCT/CN2021/134431
§ 371 (c)(1),
(2) Date: Feb. 27, 2023

(87) PCT Pub. No.: WO2022/262205
PCT Pub. Date: Dec. 22, 2022

(65) Prior Publication Data
US 2024/0029763 A1    Jan. 25, 2024

(30) Foreign Application Priority Data

Jun. 17, 2021 (CN) .......................... 202110671545.5

(51) Int. Cl.
*G11B 33/04*    (2006.01)
*H05K 7/14*    (2006.01)

(52) U.S. Cl.
CPC ....... *G11B 33/0483* (2013.01); *H05K 7/1489* (2013.01)

(58) Field of Classification Search
None
See application file for complete search history.

(56) References Cited

U.S. PATENT DOCUMENTS 10,228,734 B1 *   3/2019   Hsieh ...................... G06F 1/187
2012/0113583 A1    5/2012   Peng et al.
(Continued)

FOREIGN PATENT DOCUMENTS

CN        102543139 A     7/2012
CN        108762417 A     11/2018
(Continued)

*Primary Examiner* — James Wu
*Assistant Examiner* — Christopher L Augustin
(74) *Attorney, Agent, or Firm* — IPro, PLLC

(57) ABSTRACT

The present disclosure discloses a quick detachable hard disk bracket. When the cross beam hinging rod and the enclosure frame driving rod rotate upwards or downwards, the enclosure frame is driven to transversely move opposite to the cross beam. The locking hook is slidably assembled at the cross beam in a transverse direction. The locking hook is hinged with a hook driving rod. When the cross beam hinging rod and the enclosure frame driving rod rotate upwards or downwards, the locking hook is driven to transversely move opposite to the cross beam. When the cross beam hinging rod and the enclosure frame driving rod rotate downwards, the locking hook and the enclosure frame move in opposite directions respectively, and the locking hook and the enclosure frame move out of the two ends of the cross beam respectively.

20 Claims, 13 Drawing Sheets

(56) References Cited

U.S. PATENT DOCUMENTS

| | | | |
|---|---|---|---|
| 2012/0236494 A1 | 9/2012 | Wallace et al. | |
| 2013/0277515 A1 | 10/2013 | Pan et al. | |
| 2016/0255741 A1* | 9/2016 | Chen | G06F 1/18 |
| | | | 248/314 |
| 2017/0060176 A1* | 3/2017 | Lien | G06F 1/187 |
| 2017/0228000 A1* | 8/2017 | Yang | G11B 33/128 |
| 2020/0337171 A1* | 10/2020 | Wang | G06F 1/187 |

FOREIGN PATENT DOCUMENTS

| | | |
|---|---|---|
| CN | 111966172 A | 11/2020 |
| CN | 113253810 A | 8/2021 |

* cited by examiner

QUICK-RELEASE HARD DISK BRACKET

CROSS-REFERENCE TO RELATED APPLICATION

The present disclosure claims the priority of the Chinese patent application filed on Jun. 17, 2021 before the CNIPA, China National Intellectual Property Administration with the application number of 202110671545.5 and the title of "QUICK-RELEASE HARD DISK BRACKET", which is incorporated herein in its entirety by reference.

FIELD

The present disclosure relates to the technical field of servers and, more particularly, relates to a quick detachable hard disk bracket.

BACKGROUND

From the point of diagram of operation and maintenance, server and memory products, because of their functional requirements, require the whole machine design to achieve a variety of functional parts of the cold/hot swap may be fast, and reliably fixed, to ensure the smooth operation of business. Servers and memories and other devices require a large amount of information memory. Usually, dozens of hard disks are set up, a large number of hard disks need frequent maintenance, and the hard disks need to be repeatedly disassembled. The fixed structure of hard disks in the existing chassis are mostly fixed by screws, and a hard disk needs to be installed by four screws. The disassembly process is very complicated, and the maintenance of the whole machine is quite inconvenient.

SUMMARY

The present disclosure provides a quick detachable hard disk bracket. The hard disk is disassembled in translation relative to a cross beam to improve the maintenance efficiency of the hard disk, and the solution is as follows:

A quick detachable hard disk bracket, including a cross beam and an enclosure frame, wherein the cross beam is assembled at a hard disk frame and position-limited in a transverse direction, and a hard disk is stuck and assembled at the enclosure frame; and the enclosure frame is slidably assembled at the cross beam in the transverse direction;
  a cross beam hinging rod is assembled at and hinged with the cross beam, an enclosure frame driving rod is assembled at and hinged with the enclosure frame, the cross beam hinging rod and the enclosure frame driving rod are hinged with each other;
  a locking hook is slidably assembled at the cross beam in the transverse direction, a hook driving rod is hinged with and assembled at the locking hook, the hook driving rod is hinged with the cross beam hinging rod or the enclosure frame driving rod; and
  when the cross beam hinging rod and the enclosure frame driving rod rotate downwards, the locking hook and the enclosure frame move in opposite directions, respectively, and the locking hook and the enclosure frame move out of two ends of the cross beam, respectively, and the locking hook and the enclosure frame contact the hard disk frame to realize vertical position-limiting.

In some embodiments, a top end of the enclosure frame driving rod is hinged with a middle portion of the cross beam hinging rod; and a sliding locking key is slidably assembled at the cross beam in the transverse direction, and the sliding locking key is configured to lock the cross beam hinging rod.

In some embodiments, the sliding locking key includes a sliding plate and elastic arms, and two side edges of the sliding plate are slidably assembled at the cross beam; and
  one end of each of the two elastic arms extending in the same direction is connected to the sliding plate and the other end of each of the two elastic arms is stuck and assembled at the cross beam.

In some embodiments, the sliding plate and the elastic arms are integrally-formed by injection molding, and the elastic arms are in a wave shape; and
  an end portion of each of the elastic arms is provided with a stuck protrusion wherein the stuck protrusion is laterally stuck in an opening of the cross beam.

In some embodiments, edges of two long sides of the cross beam are bent to form a guide groove for slidingly guiding the sliding plate; and an operation channel is vertically formed throughout a middle portion of the cross beam, and an upper surface of the sliding locking key is exposed to the operation channel.

In some embodiments, an elastic restoring sheet is disposed at the enclosure frame driving rod, and the elastic restoring sheet generates an elastic force when the enclosure frame driving rod is pressed down.

In some embodiments, a hook guiding seat is assembled at the cross beam, and a hook guiding slot for inserting the locking hook is disposed throughout the hook guiding seat along a transverse direction.

In some embodiments, an outward-extended end of the locking hook is provided with a guiding lean surface with a sequentially decreasing thickness.

In some embodiments, a hard disk stuck block is detachably assembled at a side edge of the enclosure frame, and a locating pin for inserting into a threaded hole on the side edge of the hard disk is disposed at and protruded from the hard disk stuck block.

In some embodiments, the quick detachable hard disk bracket further includes a hard disk adapter frame, the hard disk adapter frame is fixedly assembled at the enclosure frame to fill a gap between the enclosure frame and the hard disk.

In some embodiments, a grounded metal sheet is disposed at the hard disk adapter.

In some embodiments, a shock absorbing pad is disposed on an inner surface of the enclosure frame by pasting.

In some embodiments, the bottom edge of the enclosure frame is provided with a gourd-shaped hole, wherein the gourd-shaped hole is configured to vertically cooperate and lock with a push pin protruding upwardly from a bottom surface of the hard disk frame.

In some embodiments, the enclosure frame is a rectangular frame with an opening, and a buckle is at the opening for fastening.

In some embodiments, one end of the cross beam is provided with a bent edge and the other end is provided with a rivet, and the bent edge and the rivet are respectively clipped into positioning slots of the hard disk frame.

The quick detachable hard disk bracket of the present disclosure has an enclosure frame slidably assembled at a cross beam, and the enclosure frame may slide relative to the cross beam along a horizontal direction. The cross beam is position-limited in a transverse direction on the hard disk frame and may not move transversely relative to the hard disk frame. The cross beam hinging rod may swing relative to the cross beam, the enclosure frame driving rod may swing relative to the enclosure frame, and the cross beam hinging rod and the enclosure frame driving rod are hinged with each other and maintain associated movement between the two. When the cross beam hinging rod and the enclosure frame driving rod rotate upwards or downwards, the enclosure frame is driven to transversely move opposite to the cross beam. The locking hook is slidably assembled at the cross beam in the transverse direction. The locking hook is assembled at and hinged with a hook driving rod. When the cross beam hinging rod and the enclosure frame driving rod rotate upwards or downwards, the locking hook is driven to transversely move opposite to the cross beam. When the cross beam hinging rod and the enclosure frame driving rod rotate downwards, the locking hook and the enclosure frame move in opposite directions respectively, and the locking hook and the enclosure frame move out of the two ends of the cross beam respectively. The locking hook and the enclosure frame respectively contact with the hard disk frame to realize vertical position-limiting; and when the hard disk moves transversely, the interface of the hard disk is matched and inserted with the socket on the hard disk frame. The device utilizes the cross beam to realize transverse position-limiting, and utilizes the transverse displacement of the locking hook and the enclosure frame to realize the vertical position-limiting, which finally ensures that the hard disk is subjected to the three-dimensional limit, and is installed in the hard disk frame. The process of limit installation is synchronized with the process of signal connection, which may greatly improve the efficiency of assembly operation and maintenance.

BRIEF DESCRIPTION OF THE DRAWINGS

In order to more clearly explain the technical solution in the embodiment or the existing technology of the present disclosure, the following will briefly introduce the drawings that need to be used in the embodiment or the existing technology description. Obviously, the drawings in the following description are only the embodiment of the present disclosure. For a person skilled in the art, other drawings may be obtained according to the provided drawings without paying creative labor.

ELEMENTS AND REFERENCE NUMBERS

Figure 1:
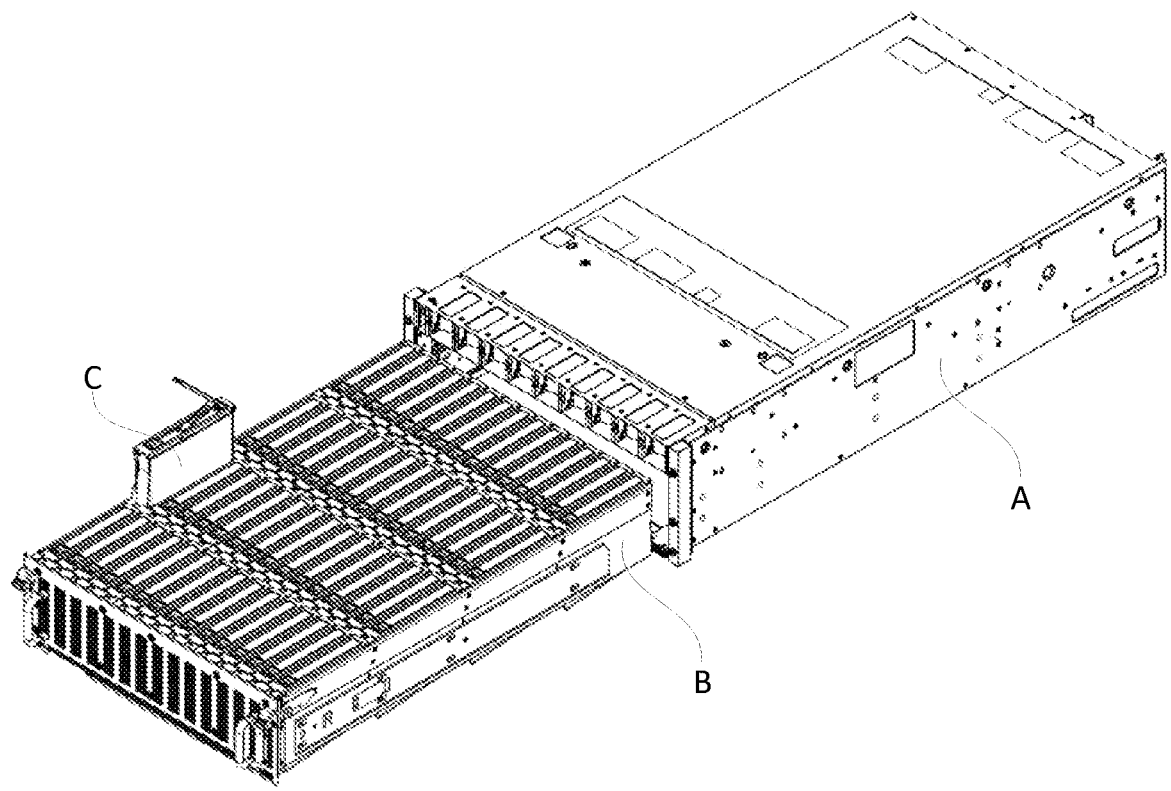
FIG. 1 is a schematic diagram of a hard disk frame being pulled out of a hard disk frame.

Cross beam 1, sliding locking key 11, sliding plate 111, elastic arm 112, stuck protrusion 113, hook guiding seat 12, hook guiding slot 121, enclosure frame 2, hard disk stuck block 21, locating pin 211, shock absorbing pad 22, gourd-shaped hole 23, cross beam hinging rod 3, enclosure frame driving rod 4, elastic restoring sheet 41, locking hook 5, hook driving rod 51, guiding lean surface 52, hard disk adapter frame 6 and grounded metal sheet 61.

DETAILED DESCRIPTION

The core of the present disclosure is to provide a quick detachable hard disk bracket, the hard disk is disassembled in translation relative to a cross beam, and the maintenance efficiency of the hard disk is improved.

In order to enable those skilled in the art to better understand the technical solution of the present disclosure, the quick detachable hard disk bracket of the present disclosure will be described in detail below in combination with the drawings and embodiments.

Figure 2A:
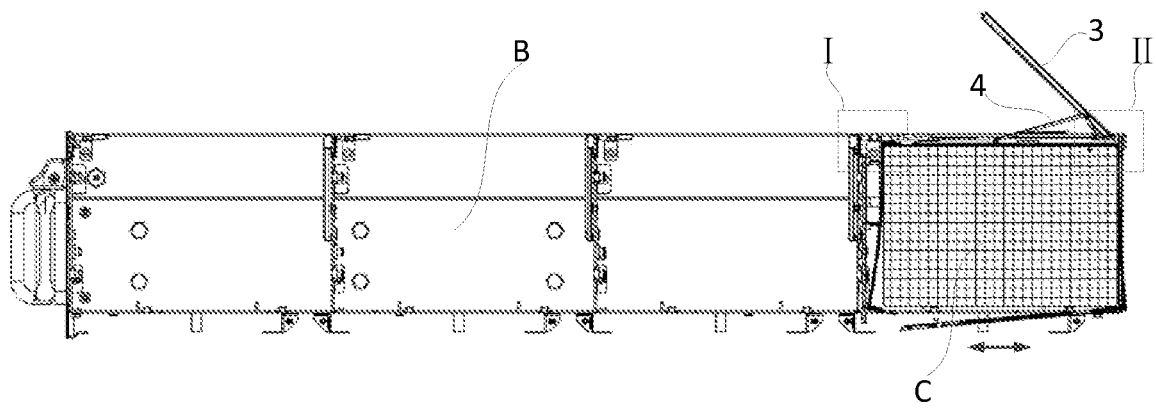
FIG. 2A is a cross-sectional view in the front direction of the hard disk frame.

The quick detachable hard disk bracket of the present disclosure includes a cross beam 1 and an enclosure frame 2, wherein the cross beam 1 is assembled at a hard disk frame and position-limited in a transverse direction and the cross beam 1 may not move relative to the hard disk frame in the transverse direction. A hard disk is stuck and assembled at the enclosure frame 2 and the enclosure frame 2 is integrated with the hard disk, and the enclosure frame 2 and the corresponding hard disk keep moving synchronously. In combination with FIG. 1, FIG. 1 is a schematic diagram of a hard disk frame being pulled out from a hard disk box. FIG. 2A is a cross-sectional view in the front direction of the hard disk frame. In the figures, A represents the hard disk box, B represents the hard disk frame and C represents a large form factor (LFF) hard disk. A plurality of hard disks may be placed in a hard disk frame.

Figure 3A:
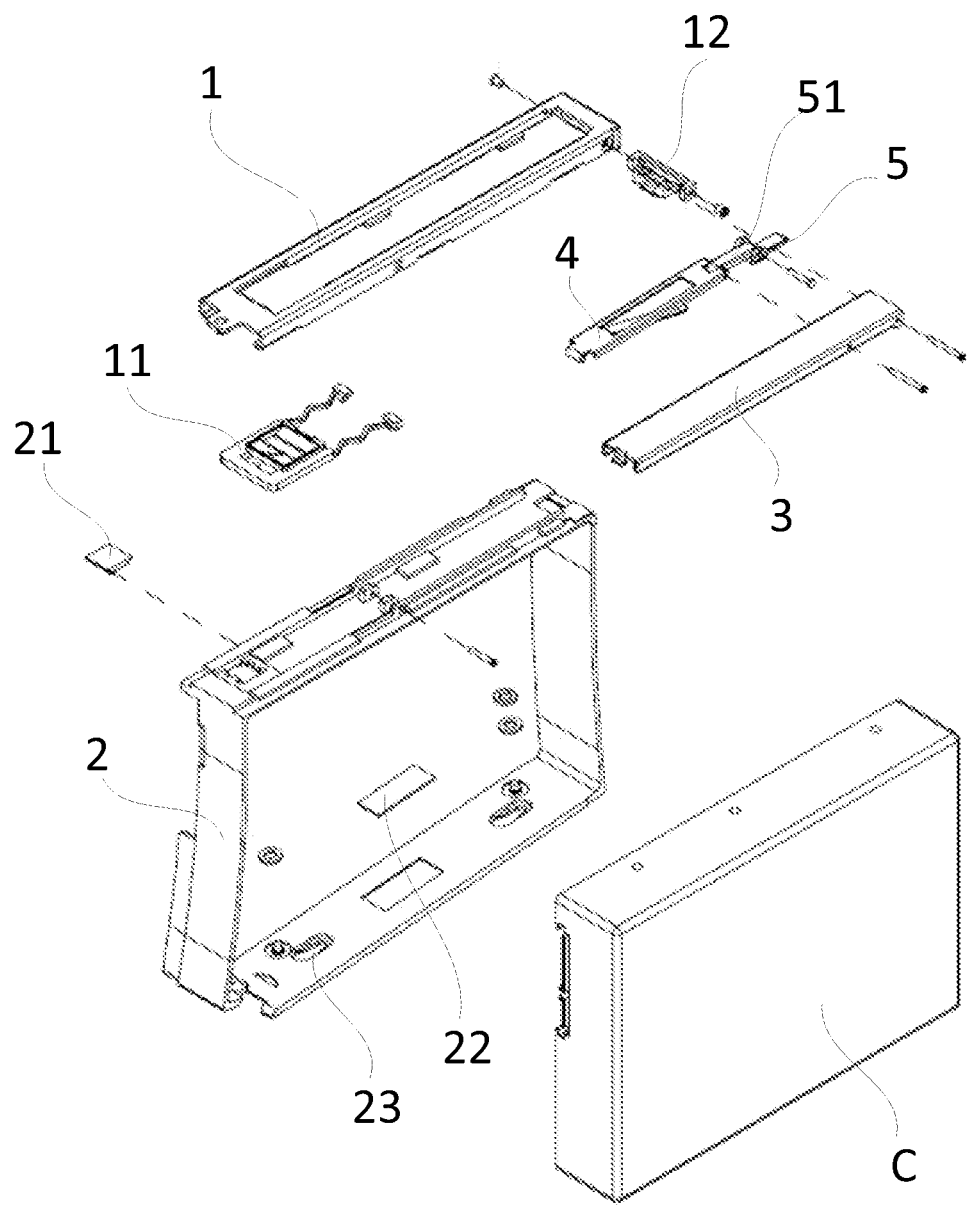
FIG. 3A is an explosion diagram of the first embodiment of the quick detachable hard disk bracket of the present disclosure.
Figure 3B:
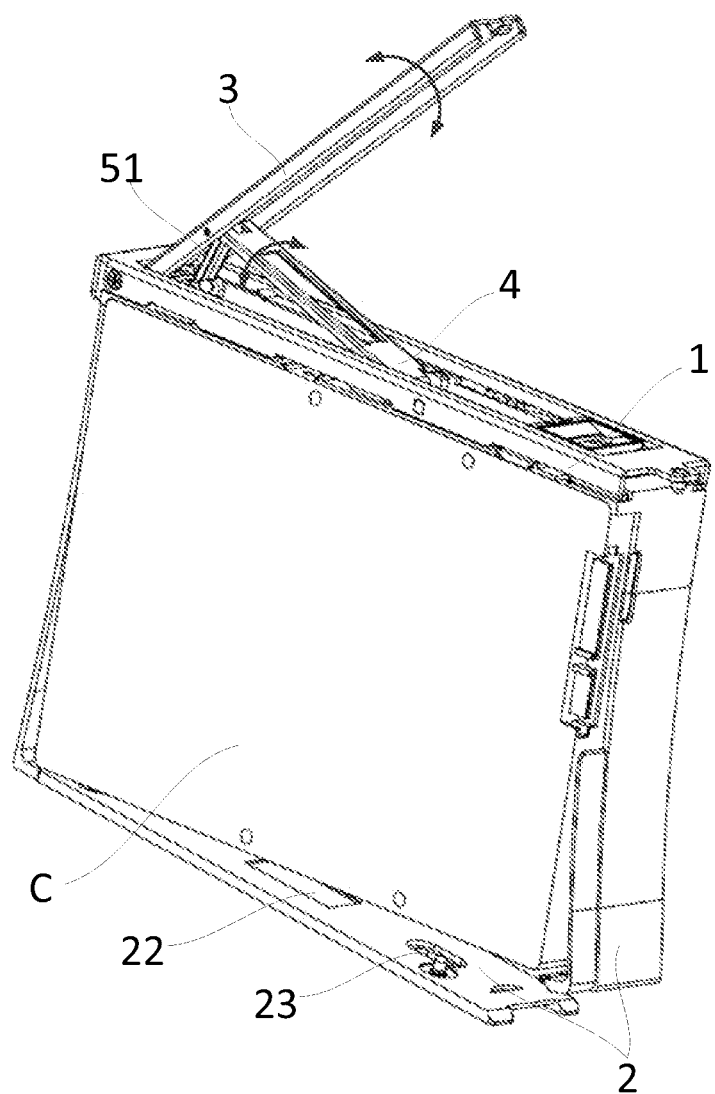
FIG. 3B is an axonometric diagram of the first embodiment of the quick detachable hard disk bracket of the present disclosure in a locked state.
Figure 3C:
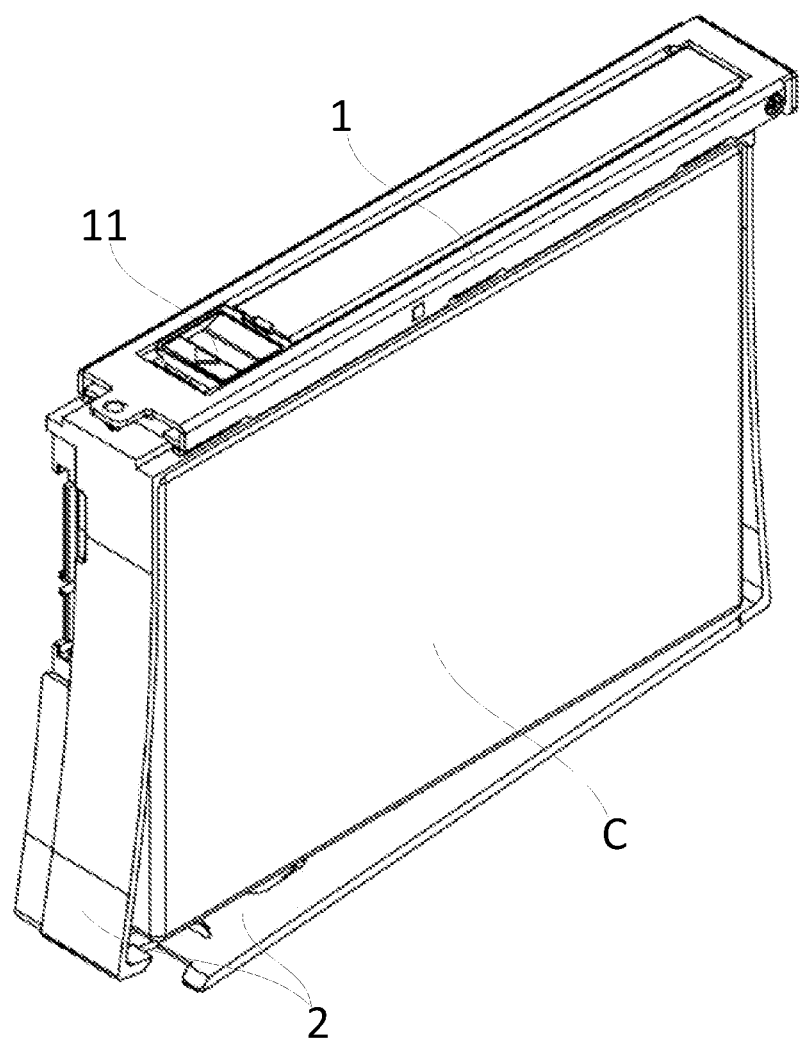
FIG. 3C is an axonometric diagram of the first embodiment of the quick-release hard disk drive bracket of the present disclosure in an unlocked state

FIG. 3A is an explosion diagram of the first embodiment of the quick detachable hard disk bracket of the present disclosure; FIG. 3B is an axonometric diagram of the first embodiment of the quick detachable hard disk bracket of the present disclosure in a locked state; FIG. 3C is an axonometric diagram of the first embodiment of the quick-release hard disk drive bracket of the present disclosure in an unlocked state. In the first embodiment, the enclosure frame 2 is configured for assembling the large form factor (LFF)

hard disk, i.e., a 3.5-inch specs hard disk, and the enclosure frame 2 is tightly fitted with the peripheral inner wall of the hard disk.

The enclosure frame 2 is slidably assembled at the cross beam 1 in the transverse direction, and the hard disk C may move transversely in the left and right directions, in combination with the two-way arrows in FIG. 2A. The cross beam 1 is assembled at and hinged with a cross beam hinging rod 3, the enclosure frame 2 is assembled at and hinged with an enclosure frame driving rod 4, and the cross beam hinging rod 3 and the enclosure frame driving rod 4 are hinged with each other. The movement between the cross beam hinging rods 3 and the enclosure frame driving rod 4 is interrelated. The cross beam hinging rod 3 and the enclosure frame driving rod 4 rotate together upwards or downwards. In combination with FIG. 3B, the cross beam hinging rod 3 and the enclosure frame driving rod 4 may rotate within a certain range along the directions shown by the respective corresponding bidirectional arc arrows. When the cross beam hinging rod 3 and the enclosure frame driving rod 4 rotate upwards together, the cross beam hinging rod 3 and the enclosure frame driving rod 4 are away from the enclosure frame 2. When the cross beam hinging rod 3 and the enclosure frame driving rod 4 rotate downwards together, the cross beam hinging rod 3 and the enclosure frame driving rod 4 are close to the enclosure frame 2.

A locking hook 5 is slidably assembled at the cross beam 1 in the transverse direction, and the locking hook 5 may transversely move relative to the cross beam 1 in the left and right directions. A hook driving rod 51 is hinged with and assembled at the locking hook, and the locking hook 5 and the hook driving rod 51 may rotate relatively. The hook driving rod 51 is hinged with the cross beam hinging rod 3 or the enclosure frame driving rod 4. Therefore, when the cross beam hinging rod 3 and the enclosure frame driving rod 4 rotate upwards or downwards together, the locking hook 5 is driven to be translated transversely through the hook driving rod 51.

As shown in FIG. 3B, the hook driving rod 51 is connected to a rotating shaft between the cross beam hinging rod 3 and the enclosure frame driving rod 4, i.e. the hook driving rod 51, the cross beam hinging rod 3, and the enclosure frame driving rod 4 are hinged together on the same rotating shaft, which is equivalent to the hook driving rod 51 being hinged with the cross beam hinging rod 3 and the enclosure frame driving rod 4.

When the cross beam hinging rod 3 and the enclosure frame driving rod 4 rotate downwards, the locking hook 5 and the enclosure frame 2 move in opposite directions, respectively, and the locking hook 5 and enclosure frame 2 respectively move out of two ends of the cross beam 1 and contact with the hard disk frame to realize the vertical position-limiting.

Figure 2B:
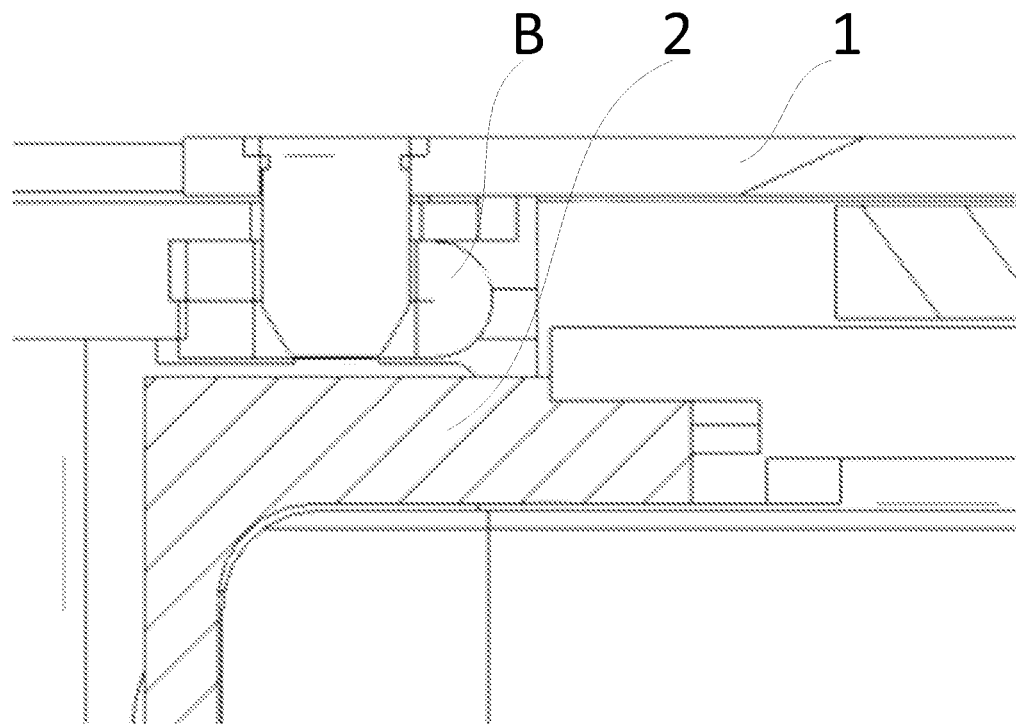
FIGS. 2B and 2C are locally enlarged diagrams of portions I and II of the dashed frames in FIG. 2A.
Figure 2C:
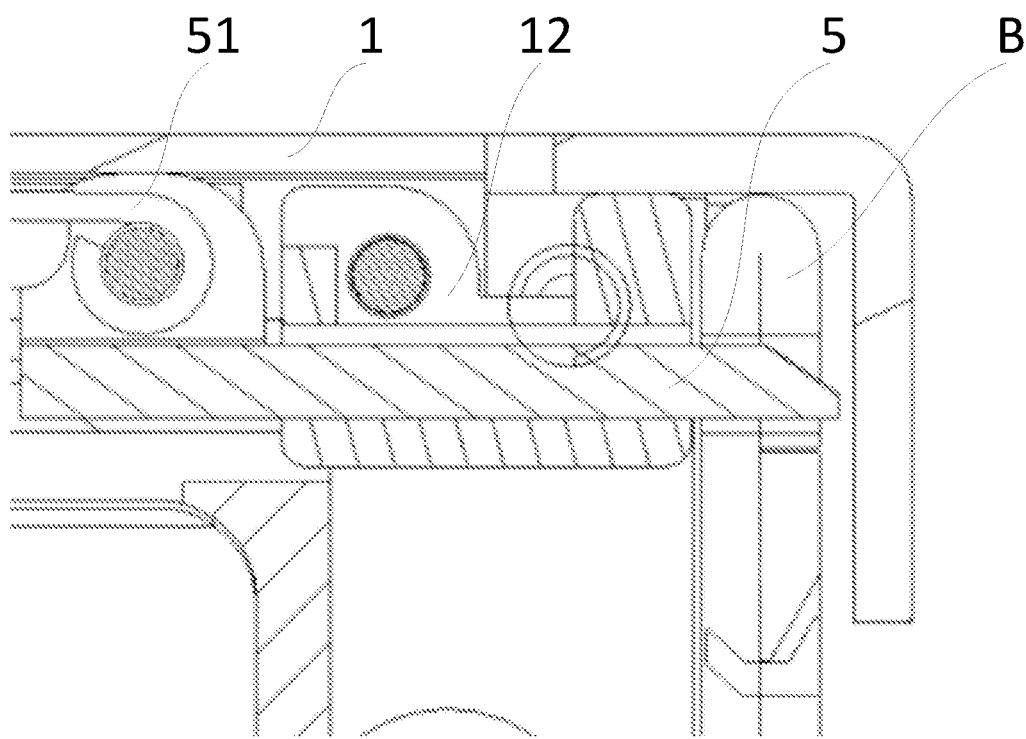

FIGS. 2B and 2C are locally enlarged diagrams of portions I and II of the dashed frames in FIG. 2A. FIG. 2B shows the cooperation between the enclosure frame 2 and the hard disk frame B, and FIG. 2C shows the cooperation between the locking hook 5 and the hard disk frame B. When the cross beam hinging rod 3 and the enclosure frame driving rod 4 rotate downwards, the enclosure frame 2 translates to the left, the locking hook 5 translates to the right, and the enclosure frame 2 and the locking hook 5 are vertically position-limited by the hard disk frame respectively. Since the cross beam 1 and the enclosure frame 2 may only be transversely translated relative to each other, and the cross beam 1 is transversely position-limited by the hard disk frame, when the whole formed by the cross beam 1 and the enclosure frame 2 is inserted into the hard disk frame, it may only be taken out by moving vertically and upwardly. When the cross beam hinging rod 3 and the enclosure frame driving rod 4 are depressed, the left side of the enclosure frame 2 is vertically blocked and position-limited by the hard disk frame and may not move upwards, and the locking hook 5 is vertically blocked and position-limited by the hard disk frame and may not move upwards, so that the integral quick detachable hard disk bracket is position-limited in the hard disk frame.

The hard disk moves synchronously with the enclosure frame 2 and the hard disk also moves synchronously to the left. The sockets on the hard disk are matched and inserted with the sockets assembled at the hard disk box to realize the signal connection. In the process of disassembly and installation, the quick detachable hard disk bracket of the present disclosure does not need to use other tools, and may be completed the assembly without tools, and the insertion and installation of the hard disk are synchronously realized in the process of limiting the hard disk, and the operation and maintenance of the hard disk are quickly and efficiently completed.

On the basis of the above solution, the top end of the enclosure frame driving rod 4 of the present disclosure is hinged with a middle portion of the cross beam hinging rod 3. One end of the cross beam hinging rod 3 may be raised upwards to provide a point of strength, and the operator may hold the end of the cross beam hinging rod 3 to realize rotational lifting or depressing downward, and during the upward or downward rotation process of the cross beam hinging rod 3, the enclosure frame driving rod 4 is driven to move synchronously, and the enclosure frame 2 is driven to transversely translate when the enclosure frame driving rod 4 moves.

A sliding locking key 11 is slidably assembled at the cross beam 1 in the transverse direction. The sliding locking key 11 may only be translated transversely. The sliding locking key 11 is configured to lock the cross beam hinging rod 3. When the cross beam hinging rod 3 rotates downwards to fit the surface of the enclosure frame 2, the sliding locking key 11 is pressed against the end of the cross beam hinging rod 3, so that the cross beam hinging rod 3 may not be lifted upwards and the hard disk is ensured in a locked state.

Figure 4A:
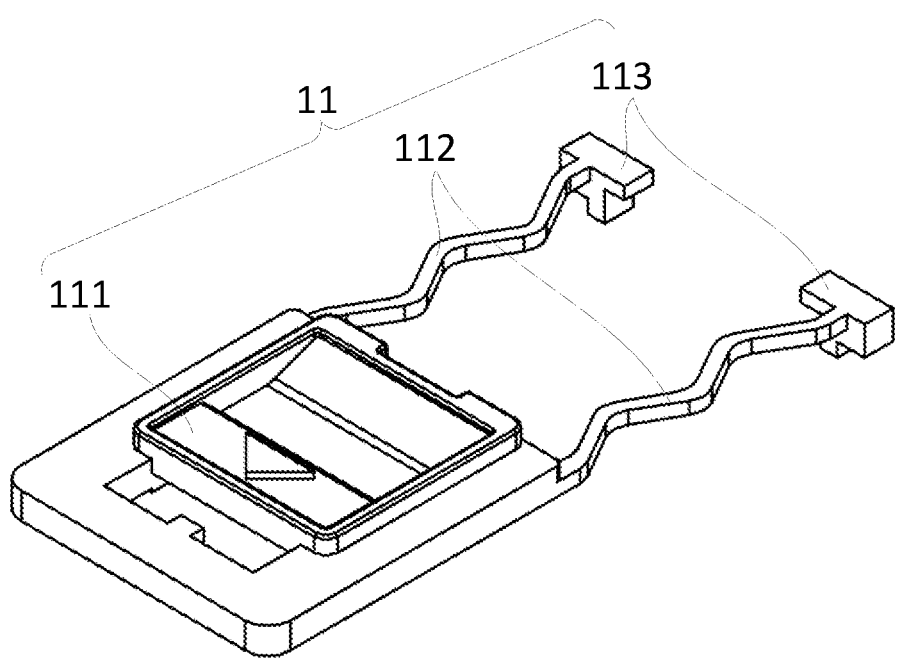
FIG. 4A is a schematic diagram showing a structure of the sliding locking key.

FIG. 4A is a schematic diagram showing a structure of the sliding locking key 11. The sliding locking key 11 includes a sliding plate 111 and elastic arms 112. Both side edges of the sliding plate 111 are slidably assembled at the cross beam 1 and the sliding plate 111 may be slid horizontally relative to the cross beam 1. One end of each of the two elastic arms 112 extending in the same direction is connected to the sliding plate 111 and the other end is stuck and assembled at the cross beam 1. A transverse elastic force is applied to the sliding plate 111 through the elastic arms 112, and the sliding plate 111 is pressed on the cross beam hinging rod 3 when it is not subjected to other external forces to prevent the cross beam hinging rod 3 from being lifted upwards.

In particular, the sliding plate 111 and the elastic arms 112 of the present disclosure are integrally-formed by injection molding, and the elastic arms 112 are in a wave shape, and the two elastic arms 112 are fixed on the same side edge of the sliding plate 111. The end portion of each of the elastic arms 112 are provided with a stuck protrusion 113, wherein the stuck protrusion 113 is laterally stuck in an opening of the cross beam 1. The stuck protrusion 113 is fixed relative to the cross beam 1, and extending directions of the elastic arms 112 are parallel to the translation direction of the sliding plate 111.

Figure 4B:
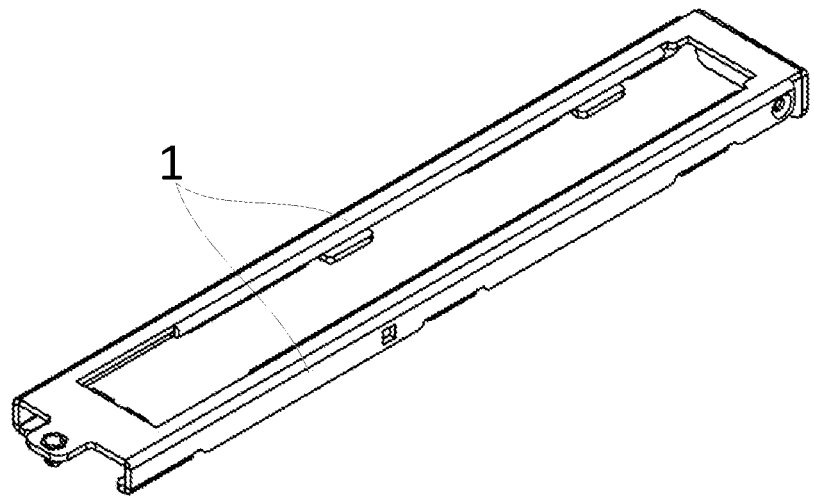
FIG. 4B is a structural schematic of a cross beam.

As shown in FIG. 4B, FIG. 4B is a schematic diagram showing a structure of the cross beam 1. Edges of two long sides of the cross beam 1 are bent to form a guide groove for slidingly guiding the sliding plate 111. The sliding plate 111 may move in translation relative to the cross beam 1. An operation channel is vertically formed throughout a middle portion of the cross beam 1, and the operation channel is a strip-shaped hole-shaped structure, an upper surface of the sliding locking key 11 is exposed to the operation channel, the operator contacts the sliding plate 111 through the operation channel, and when it needs to be unlocked, the sliding plate 111 is driven to translate, so that the elastic arms 112 is compressed, and the cross beam hinging rod 3 may be lifted upwards.

Figure 4C:
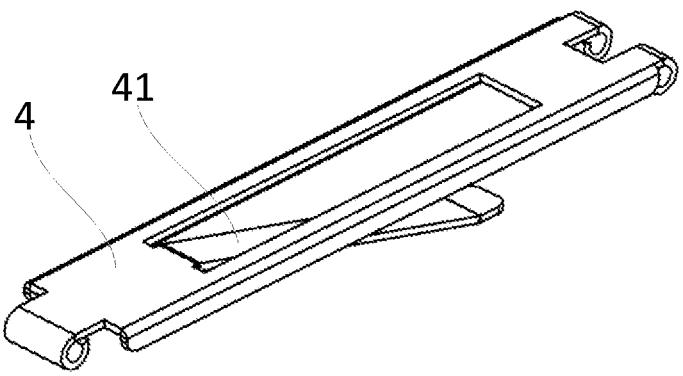
FIG. 4C is a structural diagram of an enclosure frame driving rod.

As shown in FIG. 4C, FIG. 4C is a structural diagram of a frame driving rod 4. An elastic restoring sheet 41 is disposed at the enclosure frame driving rod 4. When the enclosure frame driving rod 4 is pressed down, the elastic restoring sheet 41 generates elastic force. The elastic restoring sheet 41 shown in FIG. 4C is a cantilever structure formed by stamping the plate surface of the enclosure frame driving rod 4; an acute angle is formed between the body of the enclosure frame driving rod 4 and the elastic restoring sheet 41. The elastic restoring sheet 41 is compressed to generate elastic force when it contacts the enclosure frame 2. When the cross beam hinging rod 3 is no longer pressed, the elastic restoring sheet 41 drives the enclosure frame driving rod 4 to spring back upwards, and the cross beam hinging rod springs upwards so that the operator may pull the cross beam hinging rod 3 upwards.

Figure 4D:
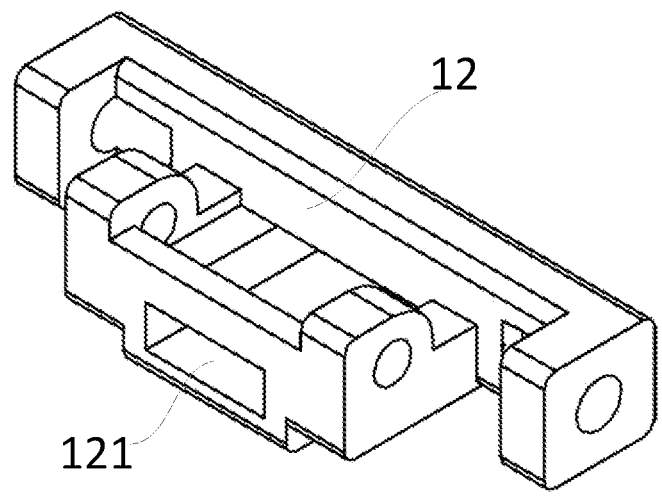
FIG. 4D is a schematic diagram showing a structure of the hook guiding seat.

As shown in FIG. 4D, it is a schematic diagram showing a structure of the hook guiding seat 12. A hook guiding seat 12 is assembled at the cross beam 1, and the hook guiding seat 12 is located at one end of the cross beam 1 and is connected to the cross beam 1 by a pin shaft. A hook guiding slot 121 for inserting of the locking hook 5 is disposed throughout the hook guiding seat 12 along a transverse direction. The hook guiding slot 121 is penetrated in the transverse direction, and the locking hook 5 may be inserted into the hook guiding slot 121 and move in translation along the penetration direction of the hook guiding slot 121.

Figure 4E:
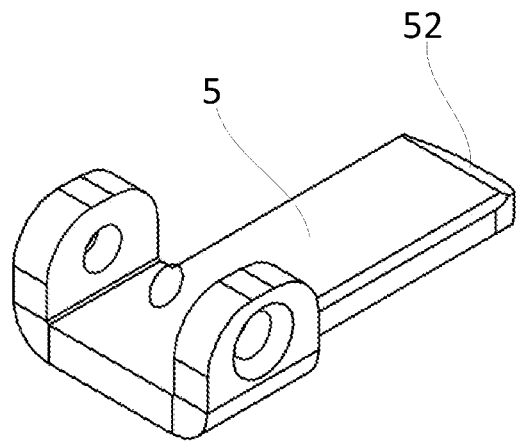
FIG. 4E is a schematic diagram showing a structure of the locking hook.

As shown in FIG. 4E, FIG. 4E is a schematic diagram showing a structure of the locking hook 5. The outward-extended end of the locking hook 5 is provided with a guiding lean surface 52 with a sequentially decreasing thickness, and the guiding lean surface 52 forms a wedge-shaped structure at the end of the locking hook 5 so as to avoid forming a barrier and facilitate insertion into a limit hole of the hard disk frame.

Figure 4F:
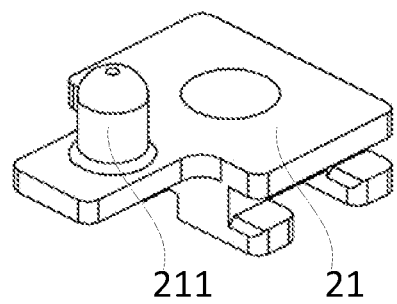
FIG. 4F is a schematic diagram showing a structure of a hard disk stuck block.

On the basis of any of the above technical solutions and their mutual combinations, a hard disk stuck block 21 is detachably assembled at a side edge of the enclosure frame 2 in the present disclosure, as shown in FIG. 4F, FIG. 4F is a schematic diagram showing a structure of the hard disk stuck block 21. A locating pin 211 for inserting into a threaded hole on the side edge of the hard disk is disposed at and protruded from the hard disk stuck block 21. The hard disk stuck block 21 is assembled in a detachable manner. The hard disk stuck block 21 is slidably assembled at the enclosure frame 2. The locating pin 211 protruding from the hard disk stuck block 21 may be inserted into the threaded hole on the side edge of the hard disk to fix the hard disk and the enclosure frame 2 into a whole.

Figure 5A:
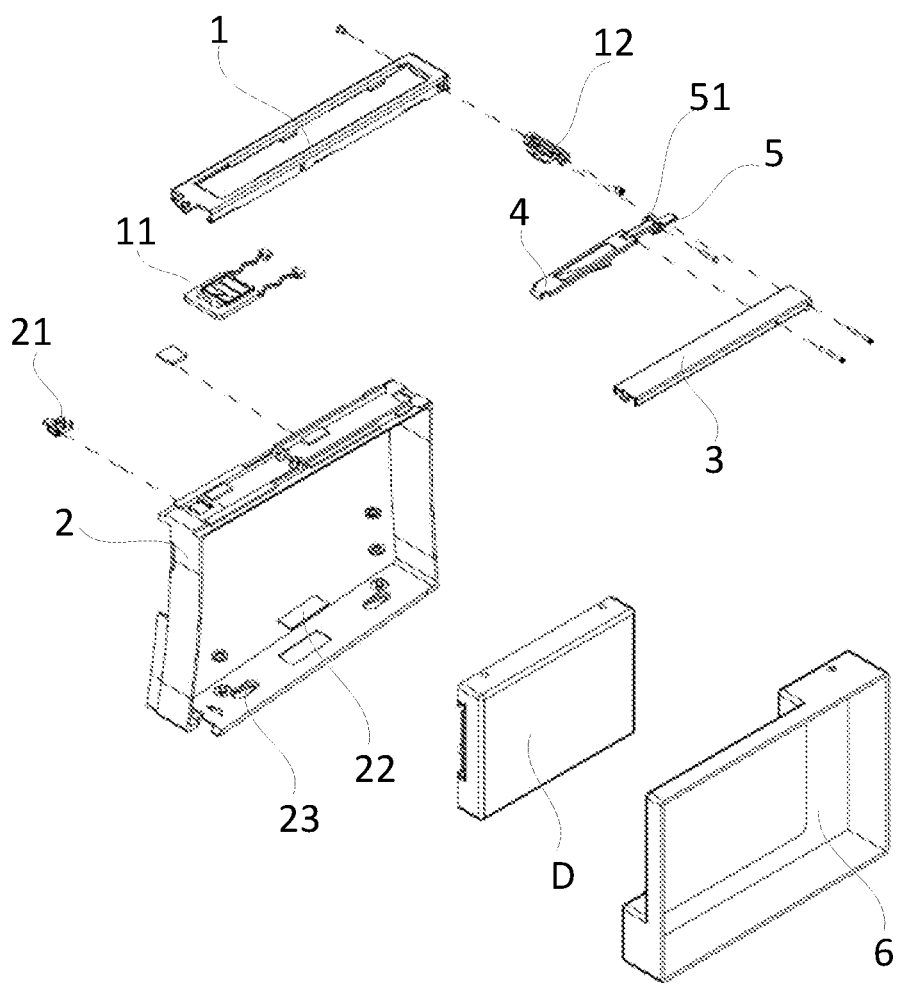
FIG. 5A is an explosion diagram of a second embodiment of the quick-release hard disk bracket of the present disclosure.
Figure 5B:
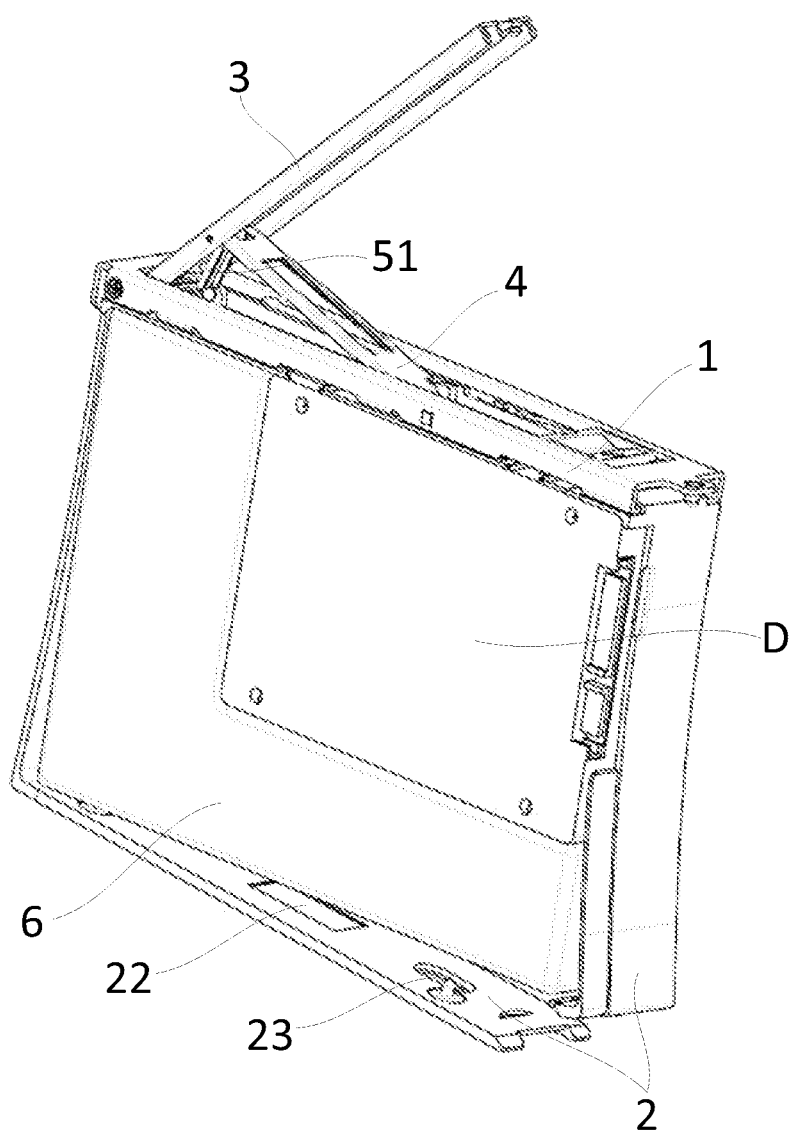
FIG. 5B is an axonometric diagram of a second embodiment of the quick-release hard disk drive bracket of the present disclosure in a locked state.
Figure 5C:
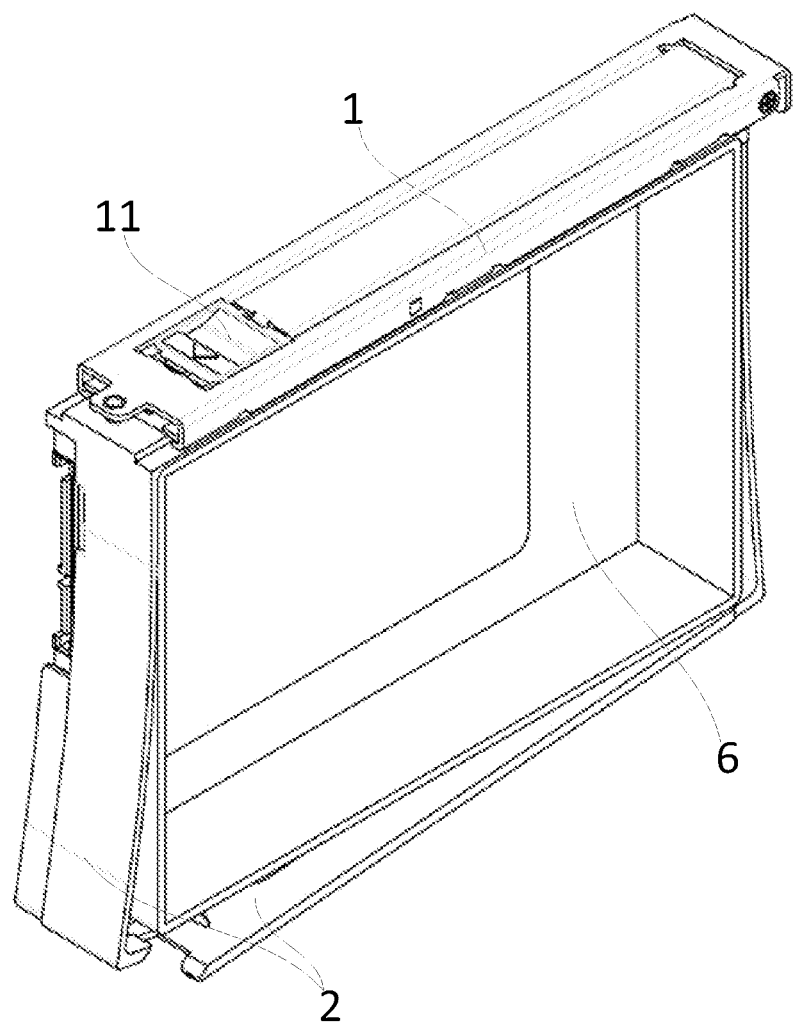
FIG. 5C is an axonometric diagram of a second embodiment of the quick detachable hard disk bracket of the present disclosure in an unlocked state.

As shown in FIG. 5A, FIG. 5A is an explosion diagram of a second embodiment of the quick detachable hard disk bracket of the present disclosure. FIG. 5B is an axonometric diagram of a second embodiment of the quick detachable hard disk bracket of the present disclosure in a locked state. FIG. 5C is an axonometric diagram of a second embodiment of the quick detachable hard disk bracket of the present disclosure in an unlocked state. The D in the figures represents the hard disk Small Form Factor (SFF), which is a 2.5-inch hard disk. A hard disk adapter 6 is also included in the second embodiment, and the hard disk adapter 6 is fixedly assembled at the enclosure frame 2 and fills the gap between the enclosure frame 2 and the hard disk. The enclosure frame that may fit the LFF hard disk may be installed with a smaller SFF hard disk through the hard disk adapter 6 to match the hard disks with different sizes.

Figure 6A:
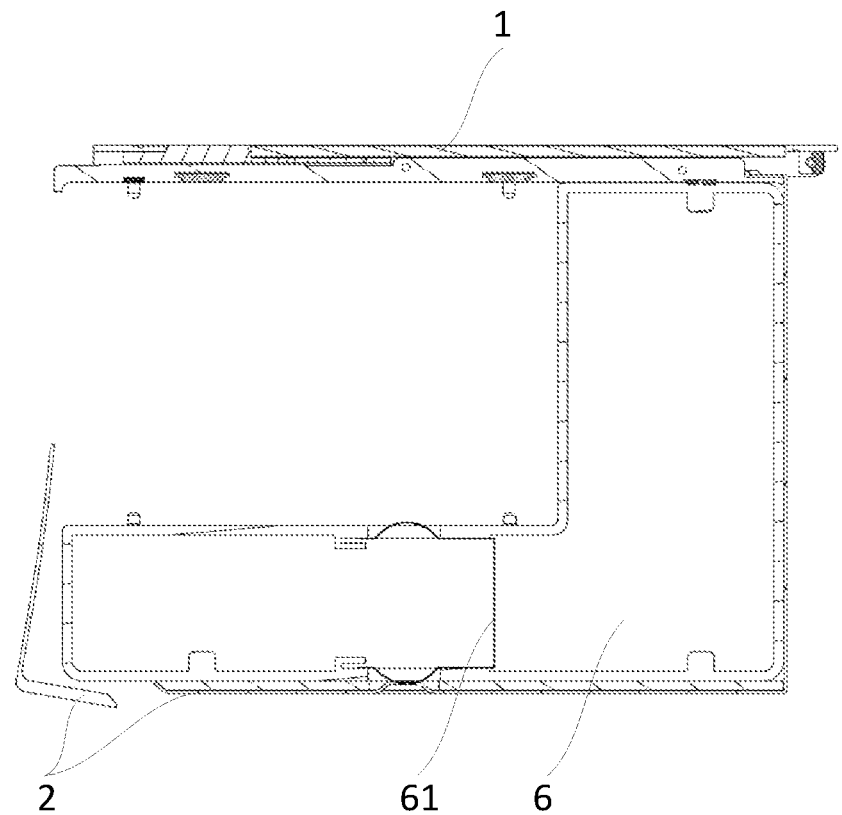
FIG. 6A is a front view of the assembly of the hard disk adapter frame and the enclosure frame.

As shown in FIG. 6A, a front view of the assembly of the hard disk adapter frame 6 and the enclosure frame 2. A grounded metal sheet 61 is disposed at the hard disk adapter 6, and the grounded metal sheet 61 is conductively connected to the hard disk and the enclosure frame, and may ground the hard disk.

Figure 6B:
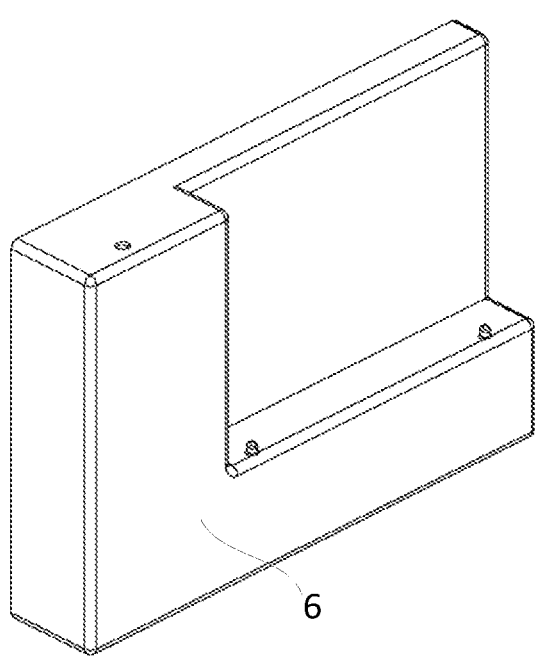
FIG. 6B is an axonometric diagram of the hard disk adapter frame.
Figure 6C:
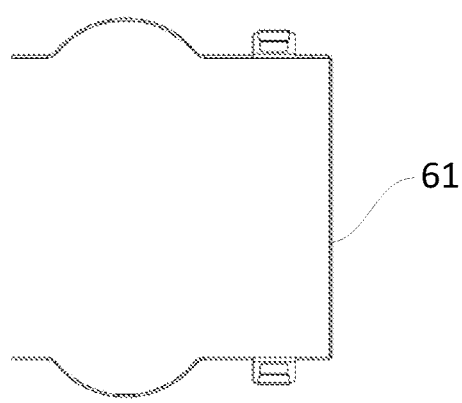
FIG. 6C is a schematic diagram of a grounded metal sheet.

FIG. 6B is an axonometric schematic diagram of the hard disk adapter 6. FIG. 6C is a schematic diagram of a grounded metal sheet 61. The hard disk adapter frame 6 is provided with a pin which may be stuck in the threaded hole of the SFF hard disk. The side edge of the hard disk adapter frame 6 itself is provided with threaded holes which may be matched and positioned with the locating pins 211 on the enclosure frame 2.

The threaded hole positions of the SFF hard disk and the LFF hard disk are different. Therefore, the hard disk stuck block 21 adopts a detachable installation mode. The hard disk stuck block 21 is installed in the corresponding position according to the difference of the matched hard disk size, thereby realizing the positioning of the hard disk.

In an embodiment, a shock absorbing pad 22 is disposed on the inner surface of the enclosure frame 2 by pasting and the shock absorbing pad 22 is made of a flexible material such as a rubber sheet, which may play a role in shock absorption.

Figure 4G:
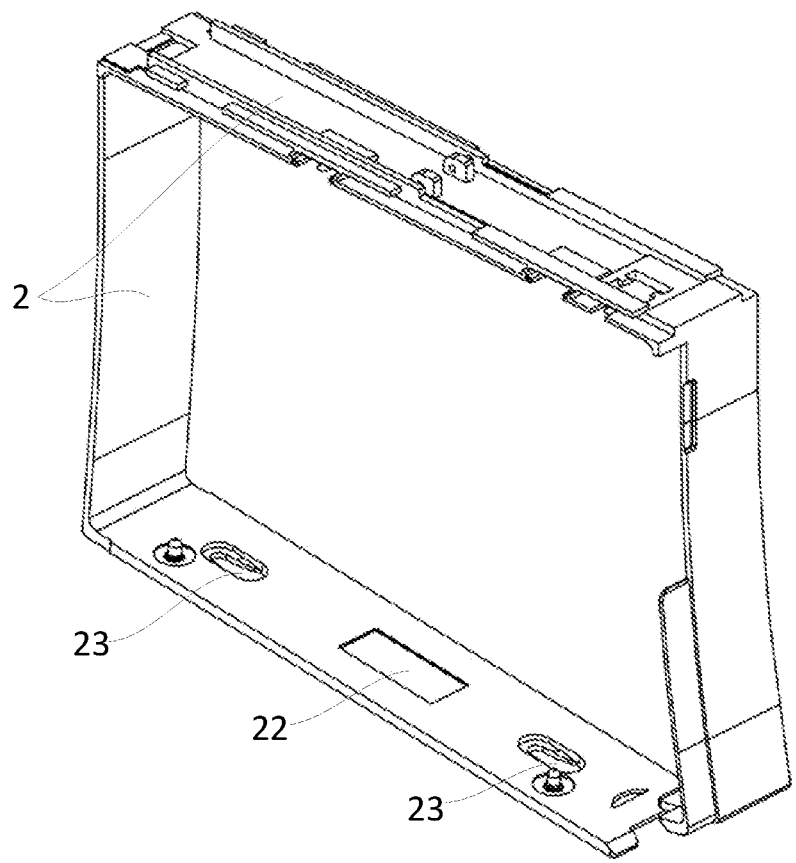
FIG. 4G is a schematic diagram showing a structure of the enclosure frame.

As shown in FIG. 4G, FIG. 4G is a schematic diagram showing a structure of the enclosure frame 2. The bottom edge of the enclosure frame 2 is provided with a gourd-shaped hole 23, and the gourd-shaped hole 23 is configured to vertically cooperate and lock with a push pin protruding upwardly from a bottom surface of the hard disk frame. The apertures of the gourd-shaped hole 23 are different in transverse direction, with one end having a larger width and the other end having a smaller width. When the enclosure frame 2 is placed into the hard disk frame, the push pin on the bottom surface of the hard disk frame extends into the position of the larger width of the gourd-shaped hole 23. When the hard disk moves horizontally, the position of the smaller width of the gourd-shaped hole 23 is matched with the push pin. At this time, the push pin locks the gourd-shaped hole 23 and limits the enclosure frame 2 from moving vertically upward. The function of auxiliary vertical locking is realized through the mutual cooperation of the gourd-shaped hole 23 and the push pin.

As shown in FIG. 4G, the enclosure frame 2 is a rectangular frame with an opening, and a buckle is at the opening for fastening. When the enclosure frame 2 surrounds the periphery of the hard disk, the buckle is stuck to achieve locking.

As shown in FIG. 4B, one end of the cross beam 1 of the present disclosure is provided with a bent edge and the other end is provided with a rivet, and the bent edge and the rivet are respectively clipped into the positioning slots of the hard disk frame to limit the transverse position of the cross beam 1, and the cross beam 1 may not move transversely.

The above description of the embodiments disclosed enables a person skilled in the art may realize and use the present disclosure. Various modifications to these embodiments will be obvious to a person skilled in the art. The general principles defined herein may be realized in other embodiments without breaking away from the spirit or scope of the present disclosure. Therefore, the present disclosure will not be limited to these embodiments shown in this specification, but to conform to the widest range consistent with the principles and novel features disclosed in this specification.

The invention claimed is:

1. A quick detachable hard disk bracket, comprising a cross beam and an enclosure frame, wherein the cross beam is assembled at a hard disk frame and position-limited in a transverse direction, and a hard disk is stuck and assembled at the enclosure frame; and the enclosure frame is slidably assembled at the cross beam in the transverse direction;
   a cross beam hinging rod is assembled at and hinged with the cross beam, an enclosure frame driving rod is assembled at and hinged with the enclosure frame, the cross beam hinging rod and the enclosure frame driving rod are hinged with each other;
   a locking hook is slidably assembled at the cross beam in the transverse direction, a hook driving rod is hinged with and assembled at the locking hook, the hook driving rod is hinged with the cross beam hinging rod or the enclosure frame driving rod; and
   when the cross beam hinging rod and the enclosure frame driving rod rotate downwards, the locking hook and the enclosure frame move in opposite directions, respectively, and the locking hook and the enclosure frame move out of two ends of the cross beam, respectively, and one end of an upper surface of the enclosure frame and the locking hook respectively contact the hard disk frame to realize vertical position-limiting.

2. The quick detachable hard disk bracket according to claim 1, wherein a top end of the enclosure frame driving rod is hinged with a middle portion of the cross beam hinging rod; and
   a sliding locking key is slidably assembled at the cross beam in the transverse direction, and the sliding locking key is configured to lock the cross beam hinging rod.

3. The quick detachable hard disk bracket according to claim 2, wherein the sliding locking key comprises a sliding plate and elastic arms, and two side edges of the sliding plate are slidably assembled on the cross beam; and
   one end of each of the two elastic arms extending in the same direction is connected to the sliding plate and the other end of each of the two elastic arms is stuck and assembled at the cross beam.

4. The quick detachable hard disk bracket according to claim 3, wherein the sliding plate and the elastic arms are integrally-formed by injection molding, and the elastic arms are in a wave shape; and
   an end portion of each of the elastic arms is provided with a stuck protrusion wherein the stuck protrusion is laterally stuck in an opening of the cross beam.

5. The quick detachable hard disk bracket according to claim 4, wherein edges of two long sides of the cross beam are bent to form a guide groove for slidingly guiding the sliding plate; and an operation channel is vertically formed throughout a middle portion of the cross beam, and an upper surface of the sliding locking key is exposed to the operation channel.

6. The quick detachable hard disk bracket according to claim 1, wherein an elastic restoring sheet is disposed at the enclosure frame driving rod, and the elastic restoring sheet generates an elastic force when the enclosure frame driving rod is pressed down.

7. The quick detachable hard disk bracket according to claim 1, wherein a hook guiding seat is assembled at the cross beam, and a hook guiding slot for inserting the locking hook is disposed throughout the hook guiding seat along a transverse direction.

8. The quick detachable hard disk bracket according to claim 1, wherein an outward-extended end of the locking hook is provided with a guiding lean surface with a sequentially decreasing thickness.

9. The quick detachable hard disk bracket according to claims 1, wherein a hard disk stuck block is detachably assembled at a side edge of the enclosure frame, and a locating pin for inserting into a threaded hole on the side edge of the hard disk is disposed at and protruded from the hard disk stuck block.

10. The quick detachable hard disk bracket according to claim 9, further comprising a hard disk adapter frame, the hard disk adapter frame is fixedly assembled at the enclosure frame to fill a gap between the enclosure frame and the hard disk.

11. The quick detachable hard disk bracket according to claim 10, wherein a grounded metal sheet is disposed at the hard disk adapter.

12. The quick detachable hard disk bracket according to claim 9, wherein a shock absorbing pad is disposed on an inner surface of the enclosure frame by pasting.

13. The quick detachable hard disk bracket according to claim 9, wherein the bottom edge of the enclosure frame is provided with a gourd-shaped hole, wherein the gourd-shaped hole is configured to vertically cooperate and lock with a push pin protruding upwardly from a bottom surface of the hard disk frame.

14. The quick detachable hard disk bracket according to claim 9, wherein the enclosure frame is a rectangular frame with an opening, and a buckle is at the opening for fastening.

15. The quick detachable hard disk bracket according to claim 9, wherein one end of the cross beam is provided with a bent edge and the other end is provided with a rivet, and the bent edge and the rivet are respectively clipped into positioning slots of the hard disk frame.

16. The quick detachable hard disk bracket according to claim 3, wherein a hook guiding seat is assembled at the cross beam, and the hook guiding seat and the cross beam are connected through a pin shaft, and a hook guiding slot for inserting the locking hook is disposed throughout the hook guiding seat along a transverse direction;
   edges of two long sides of the cross beam are bent to form a guide groove for slidingly guiding the sliding plate; and an operation channel is vertically formed throughout a middle portion of the cross beam, and an upper surface of the sliding locking key is exposed to the operation channel;
   a hard disk stuck block is detachably assembled at a side edge of the enclosure frame, and a locating pin for inserting into a threaded hole on the side edge of the hard disk is disposed and protruded from the hard disk stuck block;
   the quick detachable hard disk bracket further comprising a hard disk adapter frame, the hard disk adapter frame is fixedly assembled at the enclosure frame to fill a gap between the enclosure frame and the hard disk; and a grounded metal sheet is disposed at the hard disk adapter.

17. The quick-release type hard disk bracket according to claim 1, wherein the cross beam hinging rod and the enclosure frame driving rod are rotated together upwards or downwards.

18. The quick-release type hard disk bracket according to claim 1, wherein the hook driving rod is connected to a rotating shaft between the cross beam hinging rod and the enclosure frame driving rod.

19. A chassis, comprising a hard disk box, a hard disk frame and the quick-release type hard disk bracket according to claim 1.

20. A server, comprising a hard disk box, a hard disk frame, the hard disk and the quick-release type hard disk bracket according to claim 1.

* * * * *